(12) United States Patent
Zhang et al.

(10) Patent No.: US 9,941,387 B2
(45) Date of Patent: Apr. 10, 2018

(54) FINFET HAVING A GATE ELECTRODE WITH SIDEWALL SPACERS HAVING ASYMMETRIC DIELECTRIC CONSTANTS AND METHOD OF MANUFACTURING

(71) Applicants: Semiconductor Manufacturing International (Beijing) Corporation, Beijing (CN); Semiconductor Manufacturing International (Shanghai) Corporation, Shanghai (CN)

(72) Inventors: Hai Yang Zhang, Shanghai (CN); Zhe Zheng, Shanghai (CN)

(73) Assignees: SEMICONDUCTOR MANUFACTURING INTERNATIONAL (BEIJING) CORPORATION (CN); SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 15/350,726

(22) Filed: Nov. 14, 2016

(65) Prior Publication Data

US 2017/0200808 A1    Jul. 13, 2017

(30) Foreign Application Priority Data

Jan. 12, 2016   (CN) .......................... 2016 1 0016629

(51) Int. Cl.
   *H01L 29/66*    (2006.01)
   *H01L 29/78*    (2006.01)
   (Continued)

(52) U.S. Cl.
   CPC ............... *H01L 29/66553* (2013.01); *H01L 21/823468* (2013.01); *H01L 21/823864* (2013.01);
   (Continued)

(58) Field of Classification Search
   None
   See application file for complete search history.

(56) References Cited

U.S. PATENT DOCUMENTS

2012/0146053 A1    6/2012   Saitoh et al.
2013/0260549 A1*  10/2013   Jagannathan ..... H01L 21/28518
                                                        438/592

(Continued)

OTHER PUBLICATIONS

Kumar et al., "Performance Analysis of Dual-k Spacer at Source Side for Underlap FinFETs", Indian Institute of Technology, Roorkee, 2012, pp. 915-919.

(Continued)

*Primary Examiner* — Erik Kielin
(74) *Attorney, Agent, or Firm* — Innovation Counsel LLP (57) ABSTRACT

A semiconductor device may include the following elements: a fin member including a first doped portion, a second doped portion, and a semiconductor portion positioned between the first doped portion and the second doped portion; a composite structure including a conductor and an insulator positioned between the conductor and the semiconductor portion in a first direction; a first spacer having a first dielectric constant and positioned close to the second doped portion; a second spacer having a second dielectric constant and positioned close to the first doped portion; and a third spacer having a third dielectric constant. The second spacer is positioned between the third spacer and the fin member in the first direction. The composite structure is positioned between the first spacer and the second spacer. The first dielectric constant is less than at least one of the second dielectric constant and the third dielectric constant.

20 Claims, 10 Drawing Sheets

(51) Int. Cl.
    *H01L 29/06*      (2006.01)
    *H01L 29/423*     (2006.01)
    *H01L 21/8234*    (2006.01)
    *H01L 21/8238*    (2006.01)

(52) U.S. Cl.
    CPC .... *H01L 29/0649* (2013.01); *H01L 29/42356* (2013.01); *H01L 29/6656* (2013.01); *H01L 29/66545* (2013.01); *H01L 29/66795* (2013.01); *H01L 29/785* (2013.01); *H01L 29/7851* (2013.01)

(56) References Cited

U.S. PATENT DOCUMENTS

| | | | |
|---|---|---|---|
| 2015/0162332 A1 | 6/2015 | Kim et al. | |
| 2015/0318345 A1* | 11/2015 | Xie | H01L 29/785 257/409 |
| 2017/0117380 A1* | 4/2017 | Lu | H01L 29/6656 |

OTHER PUBLICATIONS

Kumar et al., "A Comparative Analysis of Symmetric and Asymmetric Dual-k Spacer FinFETs from Device and Circuit Perspectives", Indian Institute of Technology, Roorkee, 16th Int'l Symposium on Quality Electronic Design, 2015, 5 pages.

Posseme, et al., "Alternative process for thin layer etching: Application to nitride spacer etching stopping on silicon germanium", Applied Physics Letters 105, 051605 (2014), 5 pages.

Goel, et al., "Double-Gate MOSFETs with Aymmestric Drain Underlap: A device-circuit co-design and optimization perspective for SRAM" 2009 IEEE, 2 pages.

Kurihara, et al., "Gate CD Control Consideringt Variation of Gate and STI STructure", IEEE Transactions on Semiconductor Manufacturing, vol. 20, No. 3, Aug. 2007, pp. 232-238.

EP Search Report corresponding to EP Application No. 17150133.1, dated May 11, 2017, 9 pages.

* cited by examiner

FINFET HAVING A GATE ELECTRODE WITH SIDEWALL SPACERS HAVING ASYMMETRIC DIELECTRIC CONSTANTS AND METHOD OF MANUFACTURING

CROSS-REFERENCE TO RELATED APPLICATION

This application claims priority to and benefit of Chinese Patent Application No. 201610016629.4, filed on 12 Jan. 2016; the Chinese Patent Application is incorporated herein by reference in its entirety.

BACKGROUND

The technical field is related to a semiconductor device and a method for manufacturing the semiconductor device.

In semiconductor devices with substantially small sizes, short-channel effects may lead to unsatisfactory performance of the semiconductor devices. A semiconductor device may be implemented with a fin structure for mitigating short-channel effects. A gate structure of the semiconductor device may be implemented on the fin structure, and spacers may be implemented on sides of the gate structure for separating the gate structure from other conductive components in the semiconductor device. Structures of the spacers may affect performance of the semiconductor device.

SUMMARY

An embodiment may be related to a semiconductor device. The semiconductor device may include a fin member, a composite structure, a first dielectric spacer, a second dielectric spacer, and a third dielectric spacer.

The fin member may include a first doped portion, a second doped portion, and a semiconductor portion positioned between the first doped portion and the second doped portion. The first doped portion may function as a source region of the semiconductor device. The second doped portion may function as a drain region of the semiconductor device.

The composite structure may include a conductor and a first insulator positioned between the conductor and the semiconductor portion in a first direction. The first direction may be perpendicular to an interface between the conductor and the first insulator. The conductor may function as a gate electrode of the semiconductor device. The composite structure may function as a gate structure of the semiconductor device.

The first dielectric spacer may have a first dielectric constant. The first dielectric member may be positioned closer to the second doped portion than to the first doped portion.

The second dielectric spacer may have a second dielectric constant. The second dielectric constant may be equal to the first dielectric constant or unequal to the first dielectric constant. The second dielectric spacer may be positioned closer to the first doped portion than to the second doped portion. The second dielectric spacer may directly contact each of the first doped portion and the semiconductor portion.

The third dielectric spacer may have a third dielectric constant. The third dielectric constant may be unequal to the second dielectric constant. The first dielectric constant may be less than at least one of the second dielectric constant and the third dielectric constant. The third dielectric spacer may be positioned closer to the first doped portion than to the second doped portion. The second dielectric spacer may be positioned between the third dielectric spacer and the fin member in the first direction. The second dielectric spacer may be positioned between the third dielectric spacer and at least one of the first doped portion and the semiconductor portion in the first direction. The composite structure may be positioned between the first dielectric spacer and each of the second dielectric spacer and the third dielectric spacer in a second direction. The second direction may be perpendicular to the first direction.

A sum of a length (or thickness) of the third dielectric spacer in the first direction and a length (or thickness) of the second dielectric spacer in the first direction may be substantially equal to a length (or thickness) of the first dielectric spacer in the first direction.

The third dielectric constant may be greater than each of the first dielectric constant and the second dielectric constant.

The second dielectric constant may be greater than each of the first dielectric constant and the third dielectric constant.

Both the second dielectric spacer and the third dielectric spacer may directly contact the composite structure.

The second dielectric spacer may directly contact a side (e.g., a flat side) of the composite structure. The third dielectric spacer may directly contact the side of the composite structure.

The semiconductor device may include a dielectric layer, which may include a first dielectric portion and a second dielectric portion. The second dielectric spacer, the third dielectric spacer, the composite structure, and the first dielectric spacer may be positioned between the first dielectric portion and the second dielectric portion. Both the second dielectric spacer and the third dielectric spacer directly contact the first dielectric portion.

A first side (e.g., a first flat side) of the first dielectric portion may directly contact the fin member (e.g., may directly contact the first doped portion of the fin member). A second side (e.g., a second flat side) of the first dielectric portion may extend not parallel to the first side of the first dielectric portion and may directly contact both the second dielectric spacer and the third dielectric spacer.

The composite structure may include a second insulator, which may include a first insulating portion and a second insulating portion. The conductor may be positioned between the first insulating portion and the second insulating portion. The first insulating portion may be positioned between the conductor and each of the second dielectric spacer and the third dielectric spacer.

A side (e.g., a flat side) of the first insulating portion may directly contact both the second dielectric spacer and the third dielectric spacer.

The second insulator may include a third insulating portion, which may be positioned between the conductor and the first insulator in the first direction.

A side (e.g., a flat side) of the first insulator may directly contact the second insulator or the conductor. A side (e.g., a flat side) of the second dielectric spacer may directly contact a first side (e.g., a first flat side) of the third dielectric spacer. A second side (e.g., a second flat side) of the third dielectric spacer may be opposite the first side of the third dielectric spacer, may be parallel to the first side of the third dielectric spacer, and/or may be coplanar with a top side of the composite structure. The side of the second dielectric spacer may be parallel to the side of the first insulator and may not be positioned over the side of the first insulator in the first direction. The side of the first insulator may not be positioned between the side of the second dielectric spacer and the fin member in the first direction. The side of the first insulator may be positioned closer to the fin member than the side of the second dielectric spacer.

An embodiment may be related to a method for manufacturing a semiconductor device. The method may include the following steps: providing a fin member, which may include a first doped portion, a second doped portion, and a semiconductor portion positioned between the first doped portion and the second doped portion; providing a composite structure, which may include a conductor and a first insulator positioned between the conductor and the semiconductor portion in a first direction; providing a first dielectric spacer, which may have a first dielectric constant and may be positioned closer to the second doped portion than to the first doped portion; providing a second dielectric spacer, which may have a second dielectric constant and may be positioned closer to the first doped portion than to the second doped portion; and providing a third dielectric spacer, which may have a third dielectric constant. The third dielectric spacer may be positioned closer to the first doped portion than to the second doped portion. The second dielectric spacer may be positioned between the third dielectric spacer and the fin member in the first direction. The composite structure may be positioned between the first dielectric spacer and each of the second dielectric spacer and the third dielectric spacer. The first dielectric constant may be less than at least one of the second dielectric constant and the third dielectric constant.

The method may include the following steps: providing a dielectric member on the fin member; at least partially removing the dielectric member to form a cavity; and providing the third dielectric spacer inside the cavity.

The method may include providing a remaining portion of the dielectric member as the second dielectric spacer. The remaining portion of the dielectric member may remain after the cavity has been formed. The third dielectric spacer may be provided onto the remaining portion of the dielectric member.

The method may include the following steps: providing the second dielectric spacer into the cavity; and providing the third dielectric spacer onto the second dielectric spacer.

The method may include the following steps: forming a dummy member on the fin member; providing the dielectric member on a side of the dummy member; removing the dummy member to form a hole; and providing the conductor into the hole for forming the composite structure before forming the cavity. The cavity may at least partially expose a side (e.g., a flat side) of the composite structure. Both the second dielectric spacer and the third dielectric spacer may directly contact the side of the composite structure.

According to embodiments, an asymmetrical spacer structure with a stacked structure of a low-k dielectric spacer (e.g., the second dielectric spacer or the third dielectric spacer) and a high-k dielectric spacer (e.g., the third dielectric spacer or the second dielectric spacer) at a source side (but not at a drain side) in a semiconductor device may enable optimization of an on/off current ratio associated with the semiconductor device. Advantageously, satisfactory performance of the semiconductor device may be attained.

According to embodiments, relative sizes of the low-k dielectric spacer and the high-k dielectric spacer may be optimized by adjusting the relative heights of the low-k dielectric spacer and the high-k dielectric spacer without changing the widths of the spacers. Advantageously, optimization of a semiconductor device may be facilitated, and dimensions of the semiconductor device may be minimized.

The above summary is related to some of many embodiments disclosed herein and is not intended to limit the scope of embodiments.

BRIEF DESCRIPTION OF THE DRAWINGS

FIG. 7, FIG. 9, FIG. 13, and FIG. 15 show schematic diagrams (e.g., schematic cross-sectional views) that illustrate elements and/or structures in one or more semiconductor devices in accordance with one or more embodiments.

DETAILED DESCRIPTION

Example embodiments are described with reference to the accompanying drawings. As those skilled in the art would realize, the described embodiments may be modified in various different ways, all without departing from the spirit or scope. Embodiments may be practiced without some or all of these specific details. Well known process steps and/or structures may not have been described in detail in order to not unnecessarily obscure described embodiments.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting possible embodiments. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements should not be limited by these terms. These terms may be used to distinguish one element from another element. Thus, a first element discussed in this application may be termed a second element without departing from embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may be provided between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the embodiments. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect", "directly connect", or "indirectly connect". The term "insulate" may mean "electrically insulate". The term "conductive" may mean "electrically conductive". The term "electrically connected" may mean "electrically connected without any intervening transistors".

The term "conductor" may mean "electrically conductive member". The term "insulator" may mean "electrically insulating member". The term "dielectric" may mean "dielectric member". The term "interconnect" may mean "interconnecting member". The term "provide" may mean "provide and/or form". The term "form" may mean "provide and/or form".

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, embodiments may also cover apparatuses for practicing embodiments. Such apparatus may include circuits, dedicated and/or programmable, to carry out operations pertaining to embodiments. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments.

Figure 1:
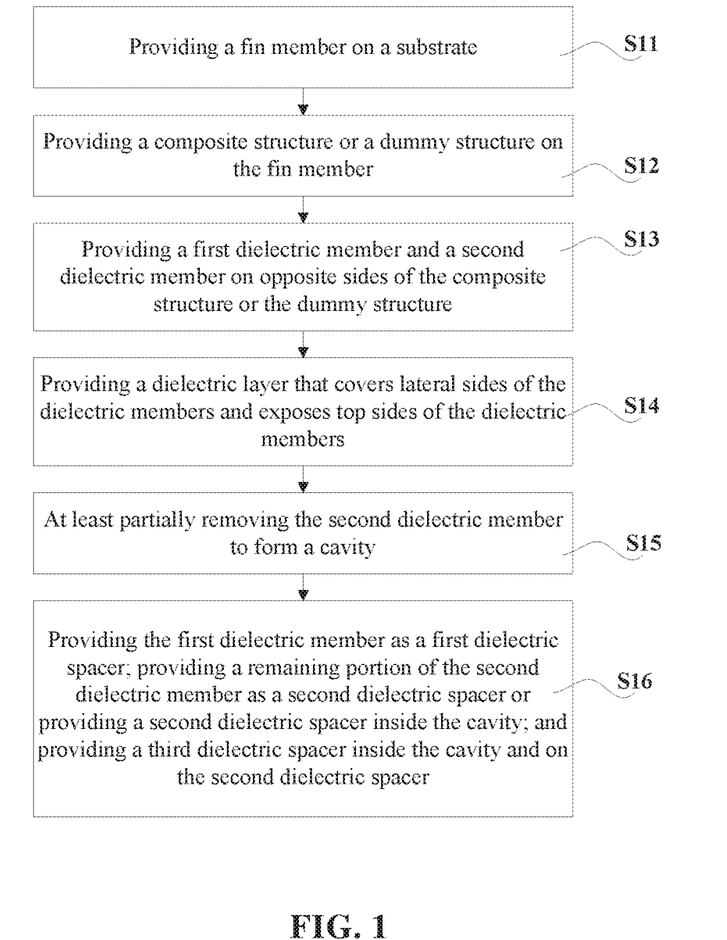
FIG. 1 shows a flowchart that illustrates steps in a method for manufacturing one or more semiconductor devices in accordance with one or more embodiments.

FIG. 1 shows a flowchart that illustrates steps in a method for manufacturing one or more semiconductor devices in accordance with one or more embodiments. The method may include steps S11, S12, S13, S14, S15, and S16. FIG. 2A, FIG. 2B, FIG. 3A, FIG. 3B, FIG. 4, FIG. 5A, FIG. 5, FIG. 6, FIG. 7, FIG. 8, FIG. 9, FIG. 10A, FIG. 10B, FIG. 11A, FIG. 11B, FIG. 12, FIG. 13, FIG. 14, and FIG. 15 show schematic diagrams (e.g., schematic cross-sectional views) that illustrate elements and/or structures formed in the method in accordance with one or more embodiments. FIG. 7, FIG. 9, FIG. 13, and FIG. 15 show schematic diagrams (e.g., schematic cross-sectional views) that illustrate elements and/or structures in one or more semiconductor devices in accordance with one or more embodiments.

Figure 2A:
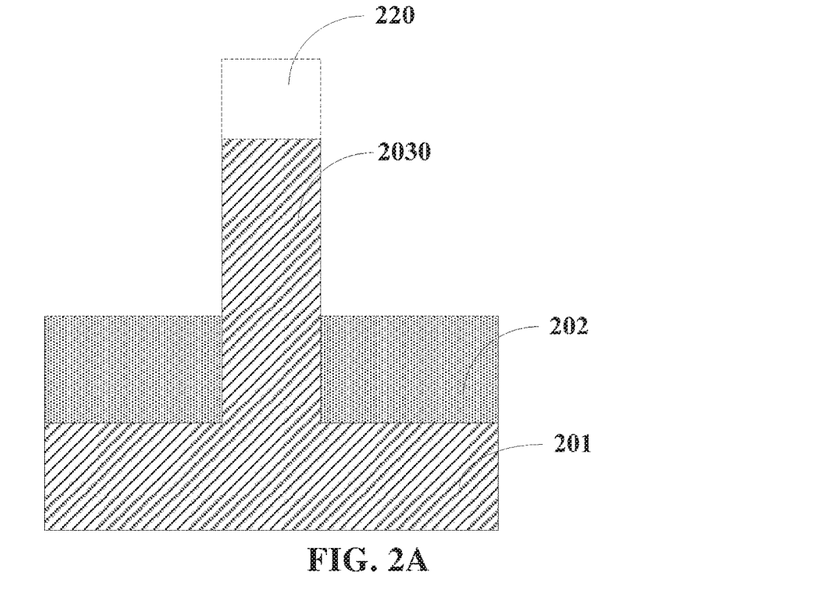
FIG. 2A and FIG. 2B show schematic diagrams (e.g., two schematic cross-sectional views taken in two different directions) that illustrate elements and/or structures formed in a step in a method for manufacturing a semiconductor device in accordance with one or more embodiments.
Figure 2B:
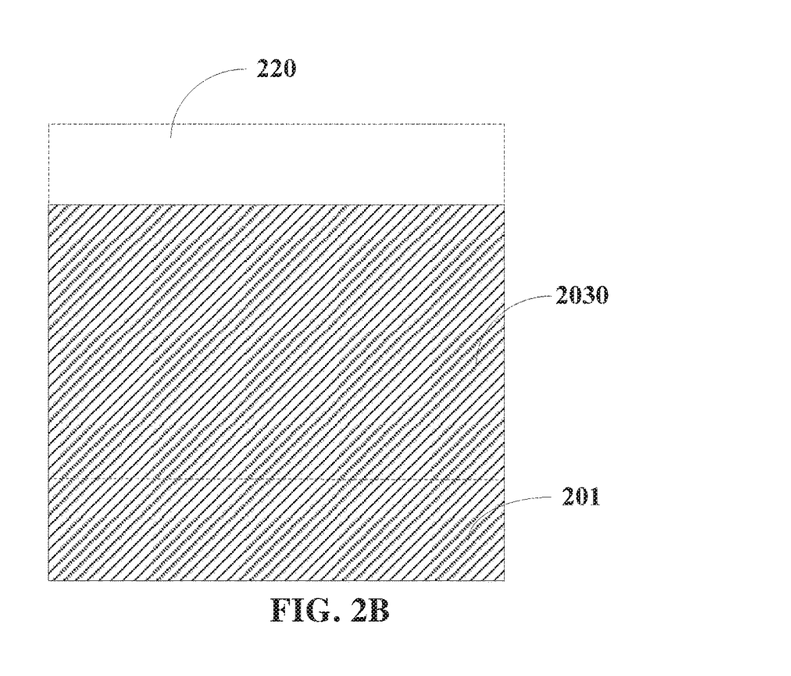

Referring to FIG. 1, FIG. 2A, and FIG. 2B, the step S11 may include providing a fin member 2030 on a substrate 201. The fin member 2030 may be formed of a semiconductor material. The method may include providing dielectric layer 202 on the substrate 201. The dielectric layer 202 may be formed of silicon dioxide. The dielectric layer 202 may cover a first portion (e.g., lower portion) of the fin member 2030 and may expose a second portion (e.g., upper portion) of the fin member 2030. The method may include providing a mask member 220 on the fin member.

The step S11 may include the following steps: providing a substrate material member (e.g., a silicon member); etching the substrate material member to form the fin member 2030 and the substrate 201; providing a dielectric material layer on the substrate 201; and etching back the dielectric material layer to form the dielectric layer 202, which may expose an upper portion of the fin member 2030.

Referring to FIG. 1, FIG. 2A, FIG. 2B, FIG. 3A, and FIG. 3B, subsequent to the step S11, the step S12 may include providing a composite structure or a dummy structure on the fin member 2030. If a composite structure is provided, the composite structure may include an insulator 204 and an element 205, wherein the the element 205 may be a conductor, such as a polycrystalline silicon member or a metal member (e.g., a TiAl member). The insulator 204 may be a pre-metal dielectric (PMD) member and may be formed of a silicon oxide material. The composite structure may function as a gate structure of a semiconductor device, and the conductor may function as a gate electrode of the semiconductor device. If a dummy structure is provided, the dummy structure may be or may include an element 205, and the element 205 may be a dummy member (e.g., a polycrystalline silicon dummy member).

Figure 3A:
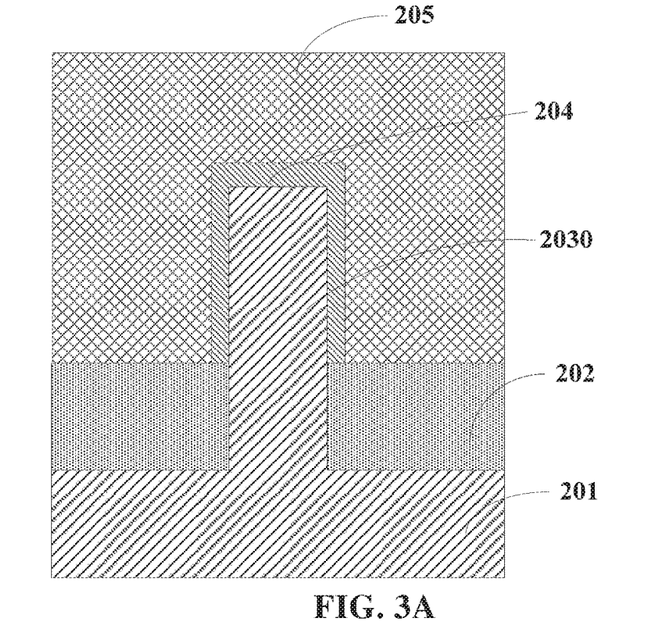
FIG. 3A and FIG. 3B show schematic diagrams (e.g., two schematic cross-sectional views taken in two different directions) that illustrate elements and/or structures formed in a step in a method for manufacturing a semiconductor device in accordance with one or more embodiments.
Figure 3B:
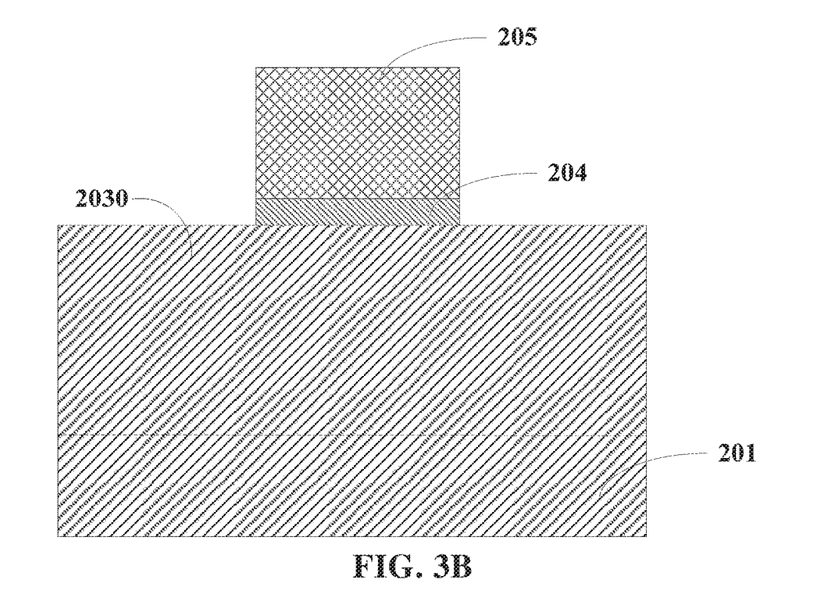

The step S12 may include the following steps: providing (e.g., through deposition) an insulating material layer on the fin member 2030 (and on the dielectric layer 202); providing (e.g., through deposition) a conductive material layer or a dummy material layer on the insulating material layer; etching the conductive material layer and the insulating material layer to form the composite structure, or etching the dummy material layer and the insulating material layer to form the composite structure.

Referring to FIG. 1, FIG. 3A, FIG. 3B, and FIG. 4, subsequent to the step S12, the step S13 may include providing a dielectric member 206 and a dielectric member 2061 respectively on two opposite sides of the composite structure or the dummy structure. The method may include forming a doped portion 207 and a doped portion 208 in the fin member 2030, e.g., using an ion implantation process and/or a doping process. A semiconductor portion 203 of the fin member 2030 may be positioned between the doped portion 207 and the doped portion 208. The doped portion 207 may function as a source region of the semiconductor device. The doped portion 208 may function as a drain region of the semiconductor device. The dielectric member 206 may be positioned closer to the doped portion 208 (i.e., drain region) than to the doped portion 207 (i.e., source region). The dielectric member 2061 may be positioned closer to the doped portion 207 (i.e., source region) than to the doped portion 208 (i.e., drain region). The dielectric members 206 and 2061 may be formed in a same process step and may be formed of a same low-k material (i.e., low dielectric constant material). Each of a dielectric constant of the dielectric member 206 and a dielectric constant of the dielectric member 2061 may be less than or equal to 3.9, such as less than 3.0 and/or less than 2.6. The dielectric members 206 and 2061 may be formed of one or more of a porous silicon oxide material (e.g., porous silicon dioxide), a porous carbon doped silicon nitride material, an amorphous carbon material, etc.

Figure 4:
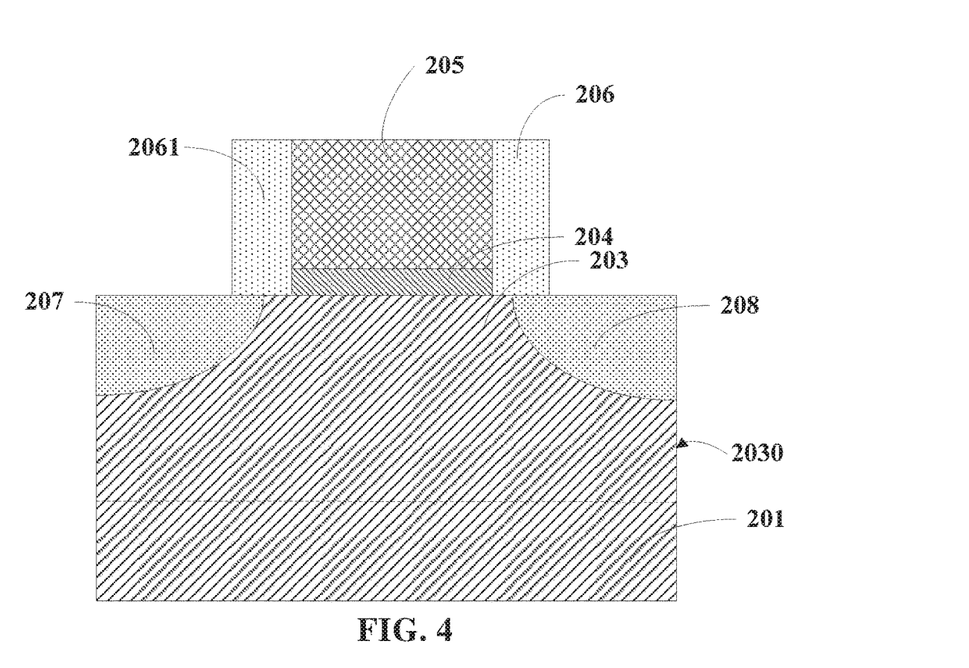
FIG. 4 shows a schematic diagram (e.g., a schematic cross-sectional view) that illustrates elements and/or structures formed in a step in a method for manufacturing a semiconductor device in accordance with one or more embodiments.
Figure 5:
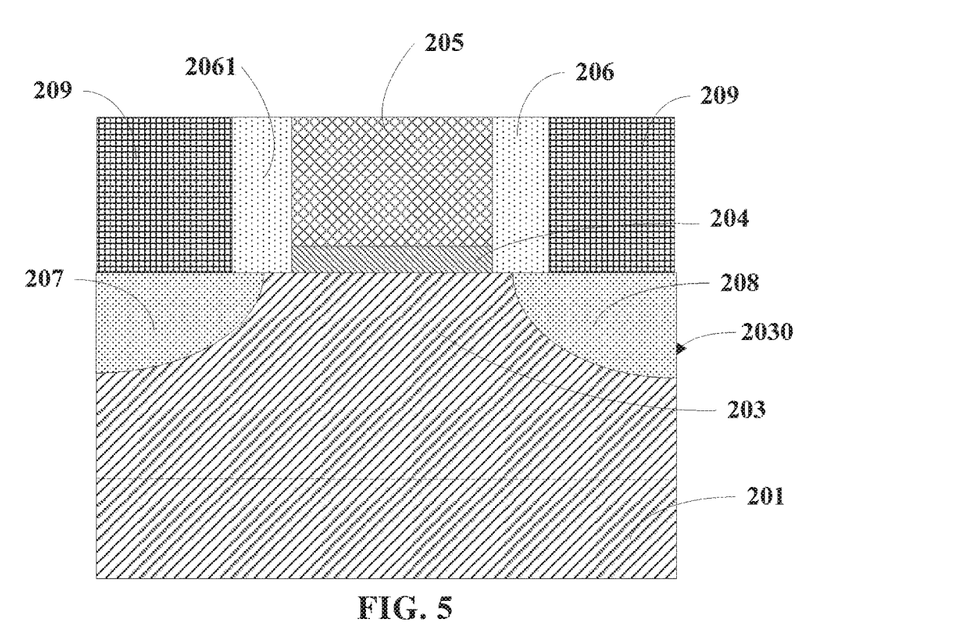
FIG. 5 shows a schematic diagram (e.g., a schematic cross-sectional view) that illustrates elements and/or structures formed in a step in a method for manufacturing a semiconductor device in accordance with one or more embodiments.
Figure 6:
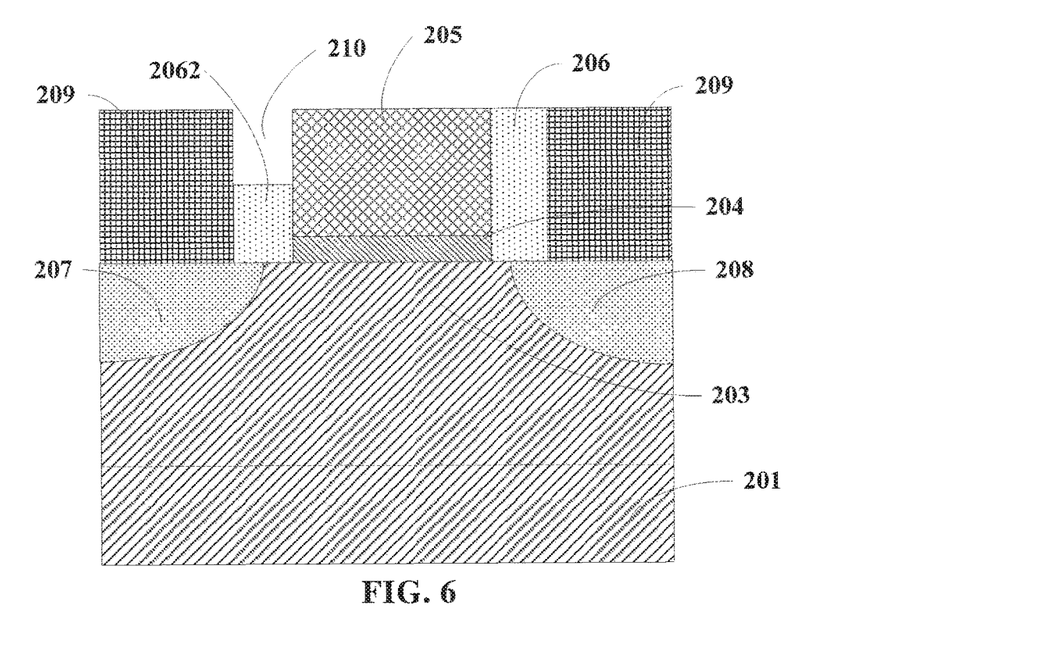
FIG. 6 shows a schematic diagram (e.g., a schematic cross-sectional view) that illustrates elements and/or structures formed in a step in a method for manufacturing a semiconductor device in accordance with one or more embodiments.
Figure 7:
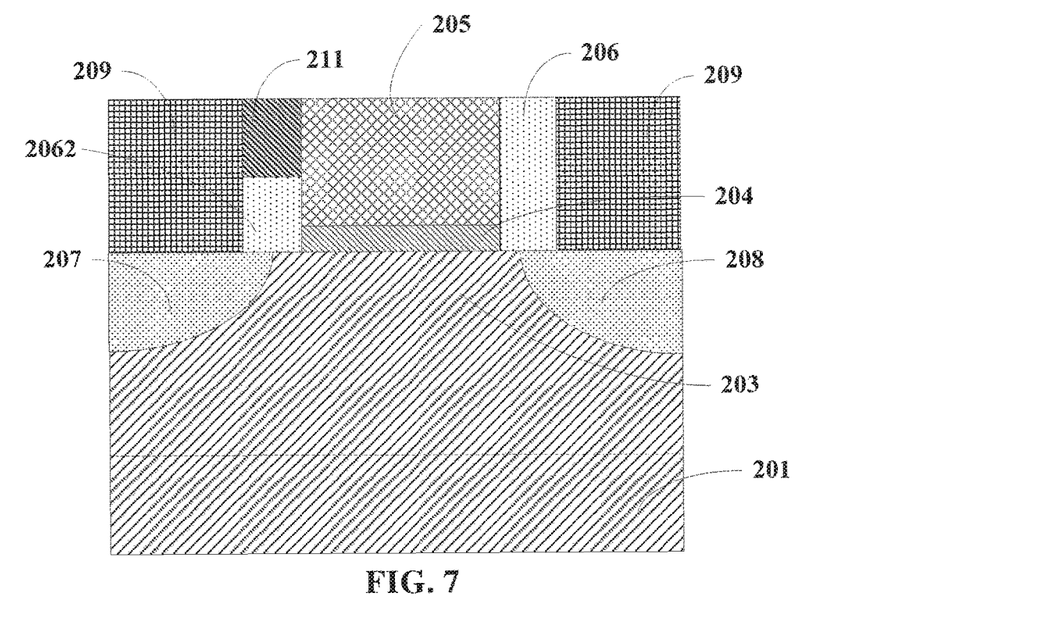
FIG. 7 shows a schematic diagram (e.g., a schematic cross-sectional view) that illustrates elements and/or structures formed in a step in a method for manufacturing a semiconductor device in accordance with one or more embodiments.
Figure 8:
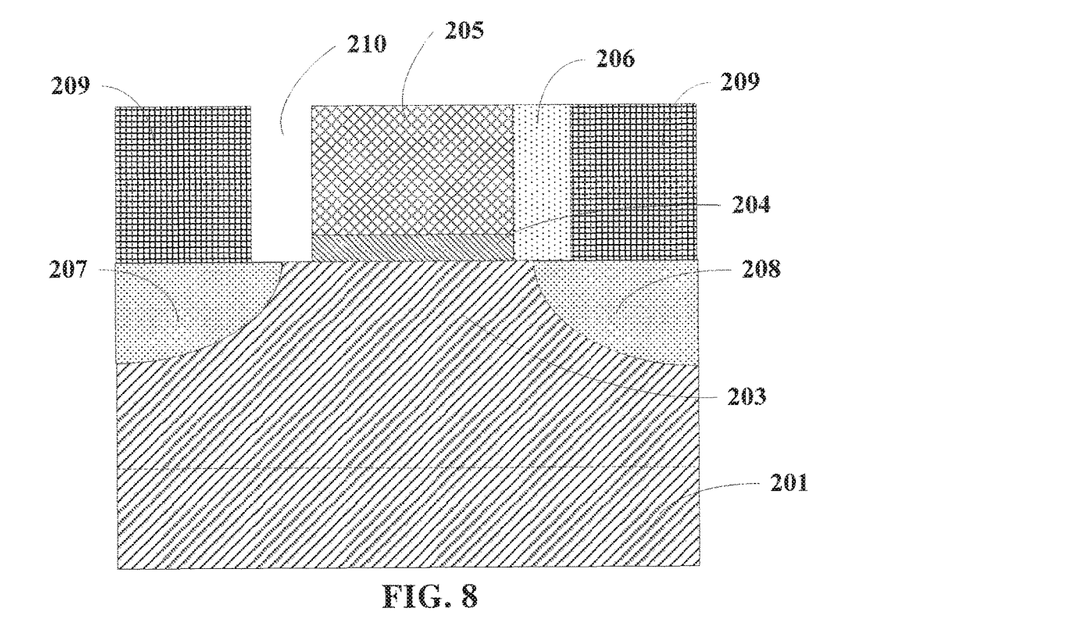
FIG. 8 shows a schematic diagram (e.g., a schematic cross-sectional view) that illustrates elements and/or structures formed in a step in a method for manufacturing a semiconductor device in accordance with one or more embodiments.
Figure 9:
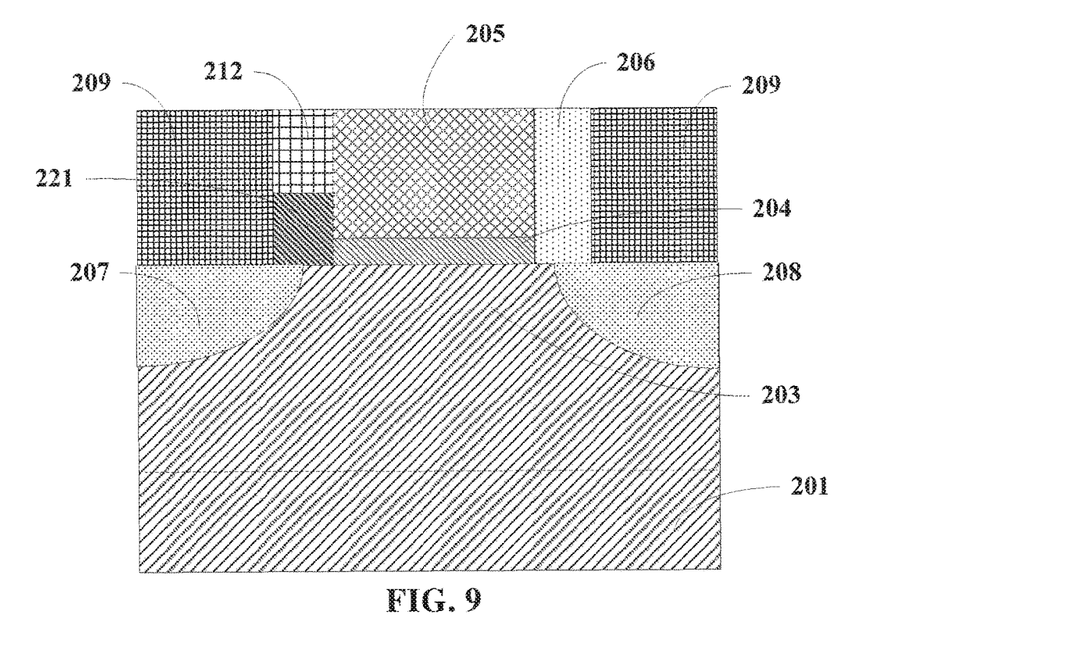
FIG. 9 shows a schematic diagram (e.g., a schematic cross-sectional view) that illustrates elements and/or structures formed in a step in a method for manufacturing a semiconductor device in accordance with one or more embodiments.

Referring to FIG. 1, FIG. 4, and FIG. 5, subsequent to the step S13, the step S14 may include providing a dielectric layer 209 that covers lateral sides of the dielectric members 206 and 2061 and exposes top sides of the dielectric members 206 and 2061. The step S14 may include the following steps: providing a dielectric material layer on all of exposed portions of the fin member 2030, the dielectric members 206 and 2061, and the composite structure or the dummy structure; and performing a planarization process (e.g., a chemical-mechanical planarization process) on the dielectric material layer to form the dielectric layer 209. A first portion (e.g., left portion illustrated in FIG. 5) of the dielectric layer 209 may directly contact the dielectric member 2061. A second portion (e.g., right portion illustrated in FIG. 5) of the dielectric layer 209 may directly contact the dielectric member 206.

Referring to FIG. 1, FIG. 5, FIG. 6, FIG. 8, 11B, FIG. 12, and FIG. 14, subsequent to the step S14, the step S15 may include at least partially removing the dielectric member 2061 (i.e., partially or substantially completely removing the dielectric member 2061) to form a cavity 210. If the dielectric member 2061 is partially (and not substantially completely) removed, a remaining portion 2062 of the dielectric member 2061 may remain on a side of the composite structure or the dummy structure.

Figure 11A:
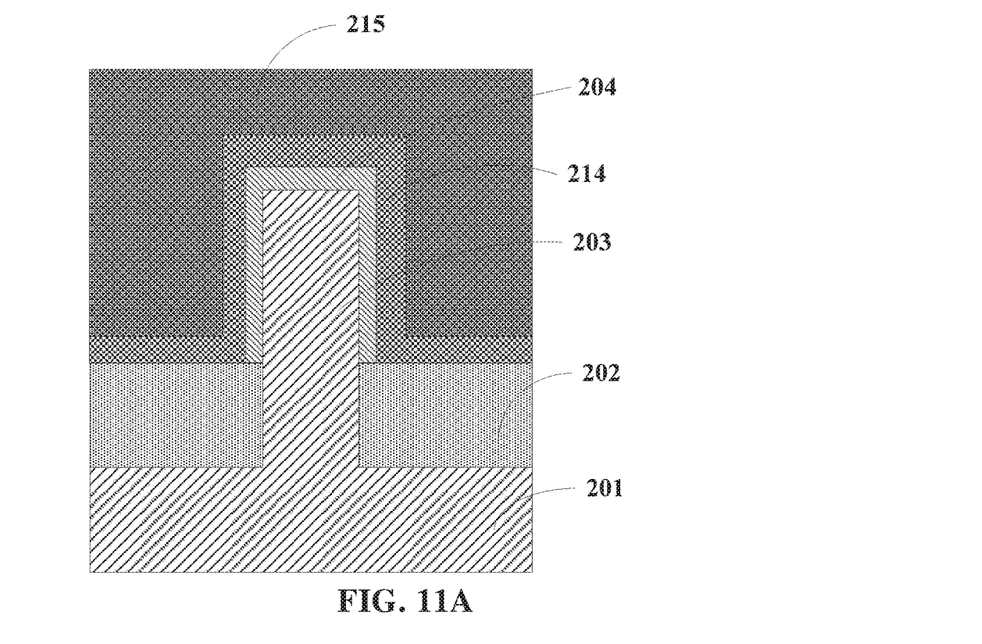
FIG. 11A and FIG. 11B show schematic diagrams (e.g., two schematic cross-sectional views taken in two different directions) that illustrate elements and/or structures formed in a step in a method for manufacturing a semiconductor device in accordance with one or more embodiments.
Figure 11B:
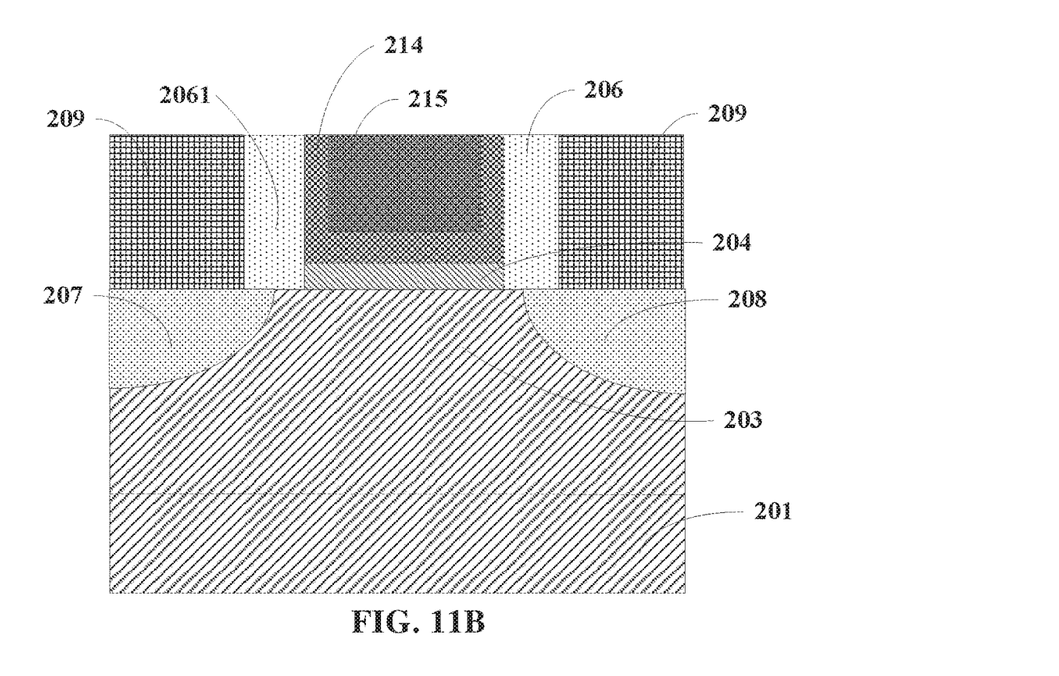
Figure 12:
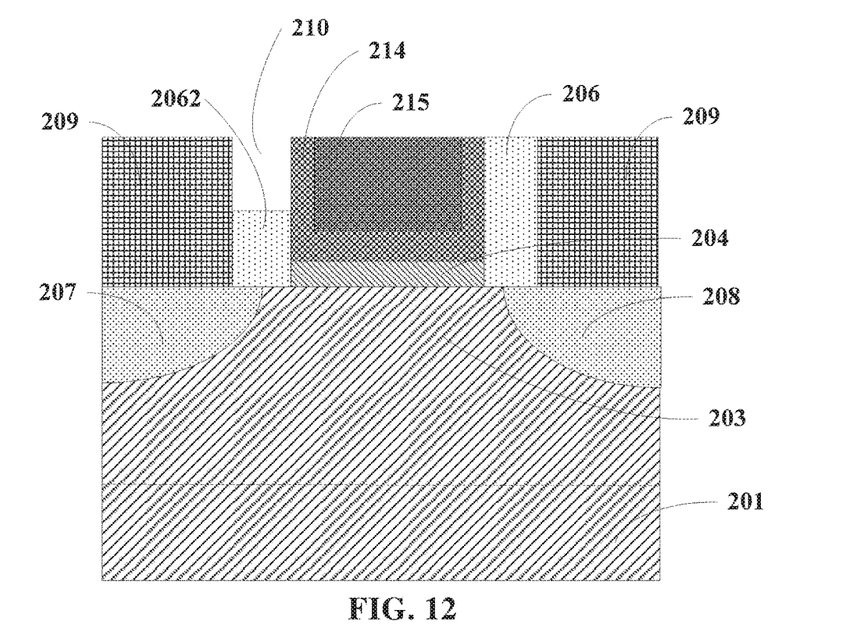
FIG. 12 shows a schematic diagram (e.g., a schematic cross-sectional view) that illustrates elements and/or structures formed in a step in a method for manufacturing a semiconductor device in accordance with one or more embodiments.

The step S15 may include the following steps: providing a patterned mask (e.g., a photoresist mask) on the structure illustrated in FIG. 5 or FIG. 11B, wherein the patterned mask may expose a top side of the dielectric member 2061; performing one or more of an ashing process, a reactive ion etching process, and a plasma etching process using a process gas that includes one or more of $O_2$, $CO_2$, $N_2$, $H_2$, and $NH_3$ to partially or substantially completely remove the dielectric member 2061; and removing the patterned mask. For optimizing precision and/or alignment, prior to the ashing and/or etching, the patterned mask may also expose a portion of the composite structure or a portion of the dummy structure that abuts the dielectric member 2061.

Referring to FIG. 1, FIG. 6, FIG. 7, FIG. 8, FIG. 9, FIG. 12, FIG. 13, FIG. 14, and FIG. 15, subsequent to the step S15, the step S16 may include the following steps: providing the dielectric member 206 as a dielectric spacer 206 of a semiconductor device; providing the remaining portion 2062 as a dielectric spacer 2062 (if the dielectric member 2061 has only been partially removed as illustrated in FIG. 6, FIG. 7, FIG. 12, and FIG. 13) or providing a dielectric spacer 221 inside the cavity 120 (if the dielectric member 2061 has been substantially completely removed as illustrated in FIG. 8, FIG. 9, FIG. 14, and FIG. 15); and providing a dielectric spacer 211 on the dielectric spacer 2062 (as illustrated in FIG. in FIG. 6, FIG. 7, FIG. 12, and FIG. 13) or providing a dielectric spacer 212 on the dielectric spacer 221 (as illustrated in FIG. 8, FIG. 9, FIG. 14, and FIG. 15).

The dielectric spacer 211 may be formed using a spin-on process. A dielectric constant of the dielectric spacer 211 may be greater than each of a dielectric constant of the dielectric spacer 206 and a dielectric constant of the dielectric spacer 2062.

The dielectric spacer 221 may be formed using a spin-on process, and the dielectric spacer 212 may be formed using a subsequent spin-on process.

In one or more embodiments, a dielectric constant of the dielectric spacer 221 may be greater than each of a dielectric constant of the dielectric spacer 206 and a dielectric constant of the dielectric spacer 212. The dielectric constant of the dielectric spacer 212 may be equal or unequal to the dielectric constant of dielectric spacer 206. The dielectric spacer 211 and/or the dielectric spacer 221 may be formed of a high-k material (i.e., high dielectric constant material). Each of a dielectric constant of the dielectric spacer 211 and a dielectric constant of the dielectric spacer 221 may be greater than 3.9 or a dielectric constant of $SiO_2$, such as greater than 10. The dielectric spacer 211 and/or the dielectric spacer 221 may be formed of one or more of a silicon nitride material, $Al_2O_3$, $Y_2O_3$, $La_2O_3$, $Ta_2O_5$, $TiO_2$, $HfO_2$, $ZrO_2$, etc. The dielectric spacer 212 may be formed of a low-k material (i.e., low dielectric constant material). A dielectric constant of the dielectric spacer 212 may be less than or equal to 3.9, such as less than 3.0 and/or less than 2.6. The dielectric spacer 212 may be formed of one or more of a porous silicon oxide material (e.g., porous silicon dioxide), a porous carbon doped silicon nitride material, an amorphous carbon material, etc. A material of the dielectric spacer 212 may be identical to or different from a material of the dielectric spacer 206.

In one or more embodiments, a dielectric constant of the dielectric spacer 212 may be greater than each of a dielectric constant of the dielectric spacer 206 and a dielectric constant of the dielectric spacer 221. The dielectric constant of the dielectric spacer 221 may be equal or unequal to the dielectric constant of dielectric spacer 206. The dielectric spacer 211 and/or the dielectric spacer 212 may be formed of a high-k material (i.e., high dielectric constant material). Each of a dielectric constant of the dielectric spacer 211 and a dielectric constant of the dielectric spacer 212 may be greater than 3.9 or a dielectric constant of $SiO_2$, such as greater than 10. The dielectric spacer 211 and/or the dielectric spacer 212 may be formed of one or more of a silicon nitride material, $Al_2O_3$, $Y_2O_3$, $La_2O_3$, $Ta_2O_5$, $TiO_2$, $HfO_2$, $ZrO_2$, etc. The dielectric spacer 221 may be formed of a low-k material (i.e., low dielectric constant material). A dielectric constant of the dielectric spacer 221 may be less than or equal to 3.9, such as less than 3.0 and/or less than 2.6. The dielectric spacer 221 may be formed of one or more of a porous silicon oxide material (e.g., porous silicon dioxide), a porous carbon doped silicon nitride material, an amorphous carbon material, etc. A material of the dielectric spacer 221 may be identical to or different from a material of the dielectric spacer 206.

If a dummy structure has been provided, referring to FIG. 5, FIG. 10A, FIG. 10B, FIG. 11A, and FIG. 11B, the method may include the following steps subsequent to the step S14 and prior to the step S15: removing the dummy structure (including the element 205 and/or the insulator 204) to form a hole 213; and providing at least a conductor 215 into the hole 213 for forming a composite structure. The composite structure may include the conductor 215 (e.g., a TiAl member) and an insulator 214 (e.g., a high-k dielectric member). The composite structure may also include the insulator 204, which may remain after the element 205 has been removed.

Figure 10A:
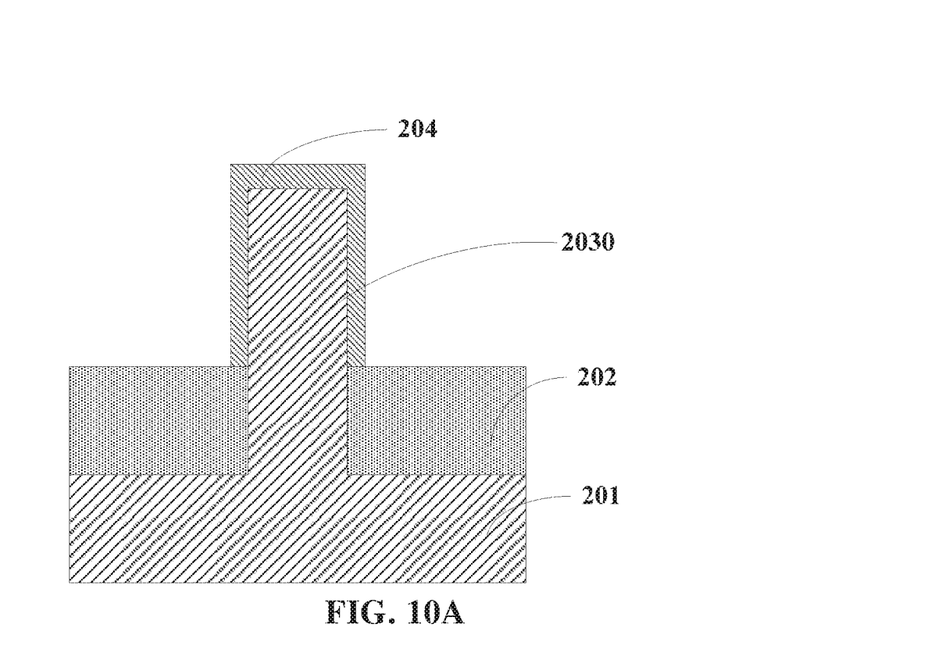
FIG. 10A and FIG. 10B show schematic diagrams (e.g., two schematic cross-sectional views taken in two different directions) that illustrate elements and/or structures formed in a step in a method for manufacturing a semiconductor device in accordance with one or more embodiments.
Figure 10B:
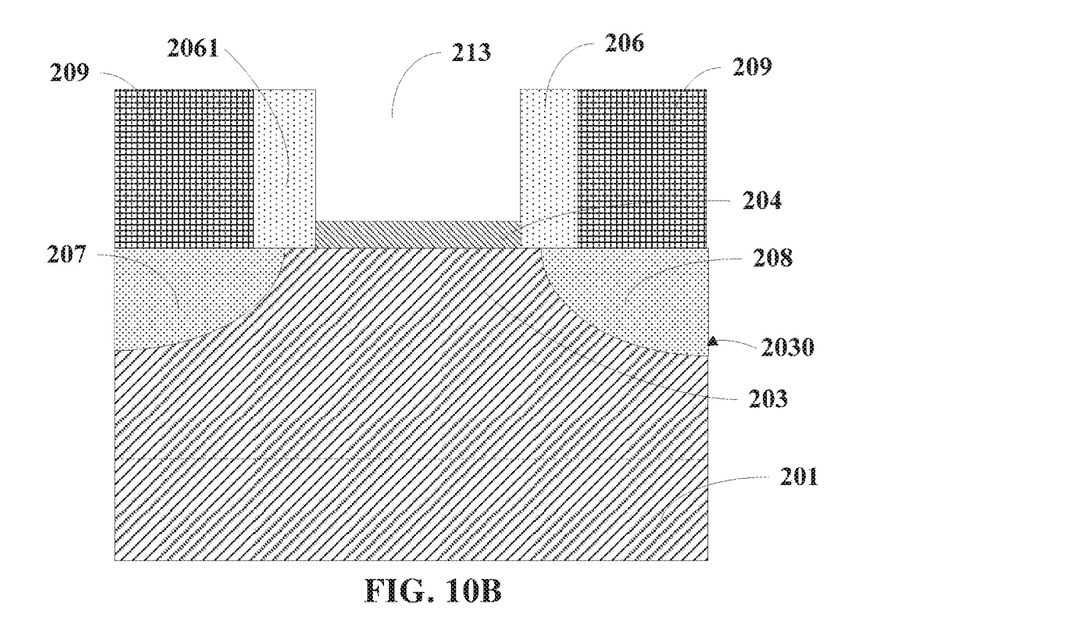

The method may include the following steps: providing an insulating material layer on the structure illustrated in FIG. 10B, wherein the insulating material layer may cover a top side of the dielectric layer 209, top sides of the dielectric members 206 and 2061, and lateral sides and a bottom side of the hole 213; providing a conductive material layer on the insulating material layer; and performing a planarization process (e.g., a chemical-mechanical planarization process) on the conductive material layer and the insulating material layer to form the conductor 215 and the insulator 214.

Referring to FIG. 7, FIG. 9, FIG. 13, and FIG. 15, according to embodiments, a semiconductor device may include a fin member 2030, a composite structure, a dielectric spacer 206, a dielectric spacer 2062 or 221, and a dielectric spacer 211 or 212.

The fin member 2030 may include a doped portion 207, a doped portion 208, and a semiconductor portion 203 positioned between the doped portion 207 and the doped portion 208. The doped portion 207 may function as a source region of the semiconductor device. The doped portion 208 may function as a drain region of the semiconductor device.

The composite structure may include a conductor 205 or 215 and an insulator 204 or 214 positioned between the conductor 205 or 215 and the semiconductor portion 203 in a first direction. The first direction may be perpendicular to an interface between the conductor 205 or 215 and the insulator 204 or 214. The conductor 205 or 215 may function as a gate electrode of the semiconductor device. The composite structure may function as a gate structure of the semiconductor device.

The dielectric spacer 206 may have a first dielectric constant. The first dielectric member may be positioned closer to the doped portion 208 than to the doped portion 207.

The dielectric spacer 2062 or 221 may have a second dielectric constant. The second dielectric constant may be equal to the first dielectric constant or unequal to the first dielectric constant. The dielectric spacer 2062 or 221 may be positioned closer to the doped portion 207 than to the doped portion 208. The dielectric spacer 2062 or 221 may directly contact each of the doped portion 207 and the semiconductor portion 203.

The dielectric spacer 211 or 212 may have a third dielectric constant. The third dielectric constant may be unequal to the second dielectric constant. The first dielectric constant may be less than at least one of the second dielectric constant and the third dielectric constant. The dielectric spacer 211 or 212 may be positioned closer to the doped portion 207 than to the doped portion 208. The dielectric spacer 2062 or 221 may be positioned between the dielectric spacer 211 or 212 and the fin member in the first direction. The dielectric spacer 2062 or 221 may be positioned between the dielectric spacer 211 or 212 and at least one of the doped portion 207 and the semiconductor portion 203 in the first direction. The composite structure may be positioned between the dielectric spacer 206 and each of the dielectric spacer 2062 or 221 and the dielectric spacer 211 or 212 in a second direction. The second direction may be perpendicular to the first direction.

A sum of a length (or thickness) of the dielectric spacer 211 or 212 in the first direction and a length (or thickness) of the dielectric spacer 2062 or 221 in the first direction may be substantially equal to a length (or thickness) of the dielectric spacer 206 in the first direction.

The third dielectric constant may be greater than each of the first dielectric constant and the second dielectric constant.

The second dielectric constant may be greater than each of the first dielectric constant and the third dielectric constant.

Both the dielectric spacer 2062 or 221 and the dielectric spacer 211 or 212 may directly contact the composite structure. The dielectric spacer 2062 or 221 may directly contact a side (e.g., a flat side of the conductor 205 or a flat side of the insulator 214) of the composite structure. The dielectric spacer 211 or 212 may directly contact the side of the composite structure.

The semiconductor device may include a dielectric layer 209, which may include a first dielectric portion (e.g., left portion of the dielectric layer 209 illustrated in FIGS. 7, 9, 13, and 15) and a second dielectric portion (e.g., right portion of the dielectric layer 209 illustrated in FIGS. 7, 9, 13, and 15). The dielectric spacer 2062 or 221, the dielectric spacer 211 or 212, the composite structure, and the dielectric spacer 206 may be positioned between the first dielectric portion and the second dielectric portion. Both the dielectric spacer 2062 or 221 and the dielectric spacer 211 or 212 directly contact the first dielectric portion. A first side (e.g., a flat bottom side) of the first dielectric portion may directly contact the fin member 2030 (e.g., may directly contact the doped portion 207 of the fin member 2030). A second side (e.g., a flat lateral side) of the first dielectric portion may extend not parallel to the first side of the first dielectric portion and may directly contact both the dielectric spacer 2062 or 221 and the dielectric spacer 211 or 212.

Figure 13:
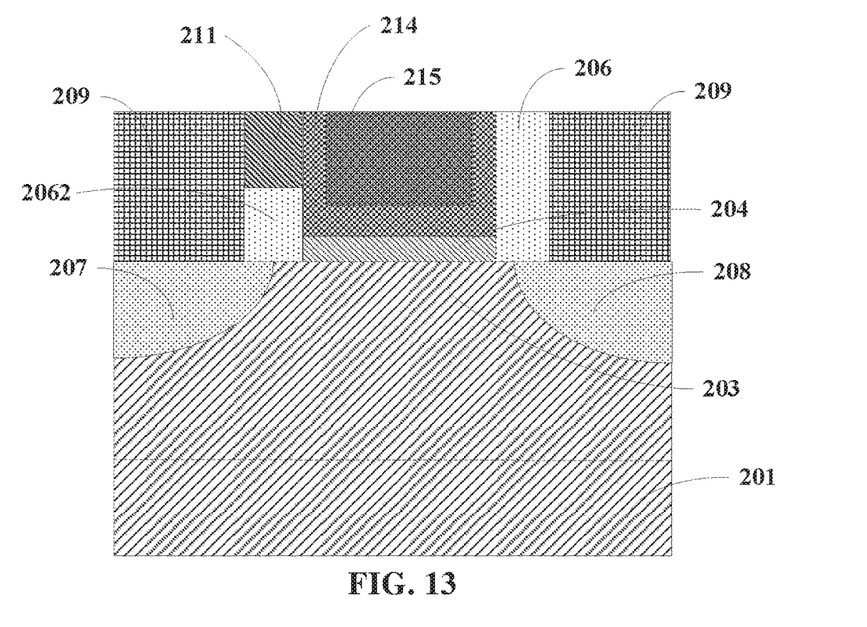
FIG. 13 shows a schematic diagram (e.g., a schematic cross-sectional view) that illustrates elements and/or structures formed in a step in a method for manufacturing a semiconductor device in accordance with one or more embodiments.
Figure 14:
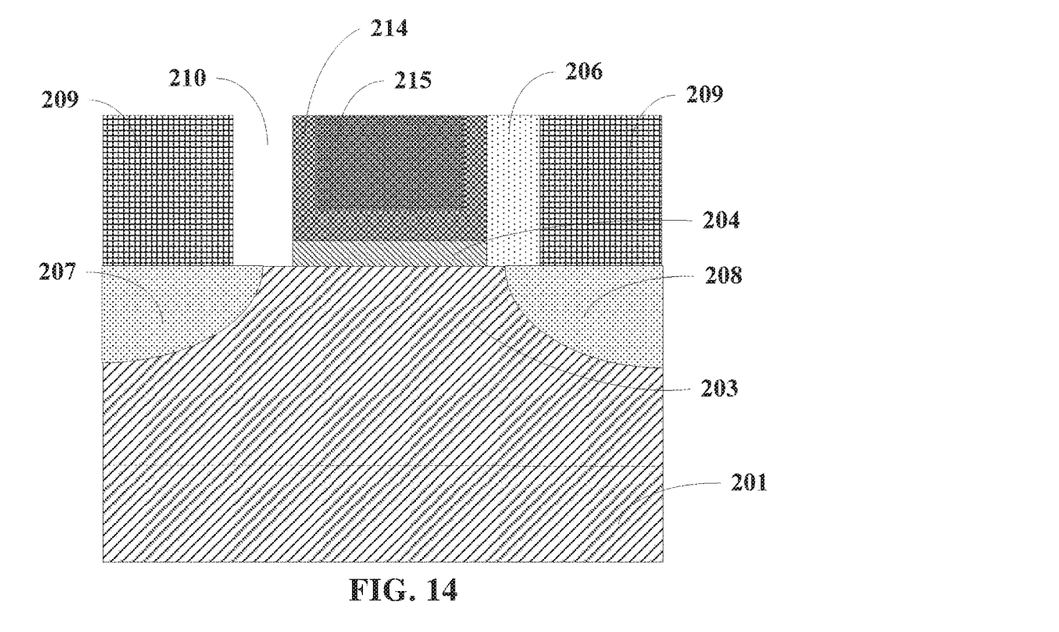
FIG. 14 shows a schematic diagram (e.g., a schematic cross-sectional view) that illustrates elements and/or structures formed in a step in a method for manufacturing a semiconductor device in accordance with one or more embodiments.
Figure 15:
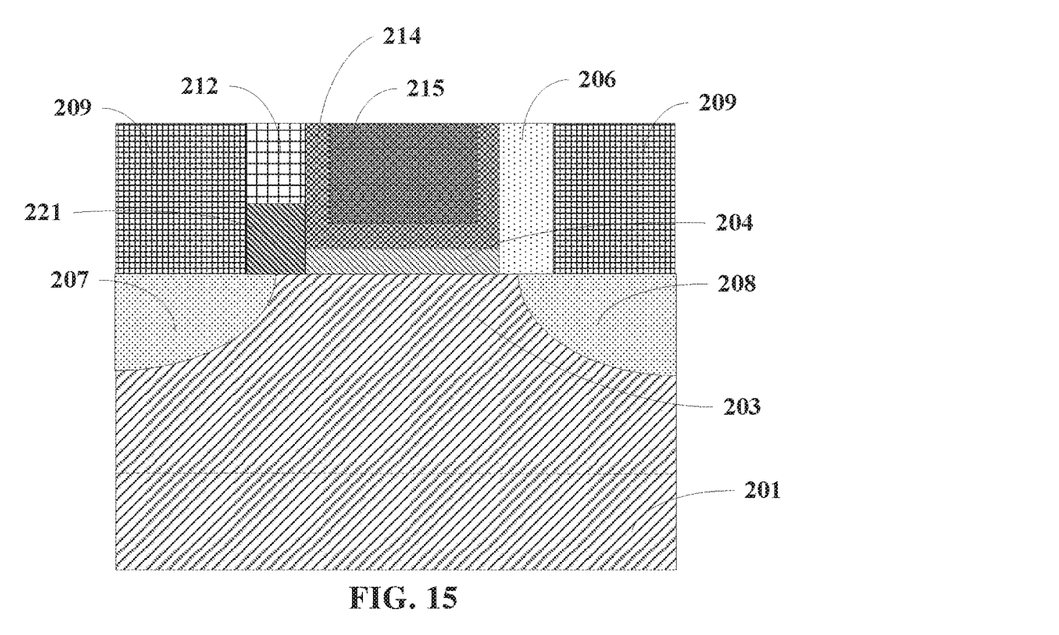
FIG. 15 shows a schematic diagram (e.g., a schematic cross-sectional view) that illustrates elements and/or structures formed in a step in a method for manufacturing a semiconductor device in accordance with one or more embodiments.

The composite structure may include an insulator 214, which may include a first insulating portion (e.g., left portion of the insulator illustrated in FIGS. 13 and 15) and a second insulating portion (e.g., right portion of the insulator illustrated in FIGS. 13 and 15). The conductor 215 may be positioned between the first insulating portion and the second insulating portion in the second direction. The first insulating portion may be positioned between the conductor 215 and each of the dielectric spacer 2062 or 221 and the dielectric spacer 211 or 212 in the second direction.

A side (e.g., a left flat side) of the first insulating portion may directly contact both the dielectric spacer 2062 or 221 and the dielectric spacer 211 or 212.

The insulator 214 may include a third insulating portion (e.g., bottom portion of the insulator illustrated in FIGS. 13 and 15), which may be positioned between the conductor 215 and the insulator 204 in the first direction.

A side (e.g., a flat top side) of the insulator 204 may directly contact the insulator 214 or the conductor 205. A side (e.g., a flat top side) of the dielectric spacer 2062 or 221 may directly contact a first side (e.g., a flat bottom side) of the dielectric spacer 211 or 212. A second side (e.g., a flat top side) of the dielectric spacer 211 or 212 may be opposite the first side of the dielectric spacer 211 or 212, may be substantially parallel to the first side of the dielectric spacer 211 or 212, and/or may be substantially coplanar with a top side of the composite structure. The side of the dielectric spacer 2062 or 221 may be parallel to the side of the insulator 204 and may not be positioned over the side of the insulator 204 in the first direction. The side of the insulator 204 may not be positioned between the side of the dielectric spacer 2062 or 221 and the fin member in the first direction. The side of the insulator 204 may be positioned closer to the fin member 2030 than the side of the dielectric spacer 2062 or 221.

According to embodiments, an asymmetrical spacer structure with a stacked structure of a low-k dielectric spacer (e.g., the dielectric spacer 2062, the dielectric spacer 221, or the dielectric spacer 212) and a high-k dielectric spacer (e.g., the dielectric spacer 211, the dielectric spacer 212, or the dielectric spacer 221) at a source side (but not at a drain side) in a semiconductor device may enable optimization of an on/off current ratio associated with the semiconductor device. Advantageously, satisfactory performance of the semiconductor device may be attained.

According to embodiments, relative sizes of the low-k dielectric spacer and the high-k dielectric spacer may be optimized by adjusting the relative heights of the low-k dielectric spacer and the high-k dielectric spacer without changing the widths of the spacers. Advantageously, optimization of a semiconductor device may be facilitated, and dimensions of the semiconductor device may be minimized.

While some embodiments have been described as examples, there are alterations, permutations, and equivalents. It should be noted that there are many alternative ways of implementing the methods and apparatuses. Furthermore, embodiments may find utility in other applications. The abstract section is provided herein for convenience and, due to word count limitation, is accordingly written for reading convenience and should not be employed to limit the scope of the claims. It is intended that the following appended claims be interpreted as including all alterations, permutations, and equivalents.

What is claimed is:

1. A semiconductor device comprising:
   a fin member, which comprises a first doped portion, a second doped portion, and a semiconductor portion positioned between the first doped portion and the second doped portion;
   a composite structure, which comprises a conductor and a first insulator positioned between the conductor and the semiconductor portion in a first direction;
   a first dielectric spacer, which has a first dielectric constant and is positioned closer to the second doped portion than to the first doped portion;
   a second dielectric spacer, which has a second dielectric constant and is positioned closer to the first doped portion than to the second doped portion; and
   a third dielectric spacer, which has a third dielectric constant, wherein the third dielectric constant is unequal to the second dielectric constant, wherein the first dielectric constant is less than at least one of the second dielectric constant and the third dielectric constant, wherein the composite structure is positioned between the first dielectric spacer and each of the second dielectric spacer and the third dielectric spacer, wherein the composite structure directly contacts each of a face of the first dielectric spacer, a face of the second dielectric spacer, and a face of the third dielectric spacer, wherein all of the face of the first dielectric spacer has the first dielectric constant, wherein a sum of a length of the face of the third dielectric spacer and a length of the face of the second dielectric spacer is equal to a length of the face of the first dielectric spacer, and wherein the second dielectric spacer is positioned between the third dielectric spacer and the fin member in the first direction.

2. The semiconductor device of claim 1, wherein a sum of a length of the third dielectric spacer in the first direction and a length of the second dielectric spacer in the first direction is equal to a length of the first dielectric spacer in the first direction.

3. The semiconductor device of claim 1, wherein the third dielectric constant is greater than each of the first dielectric constant and the second dielectric constant.

4. The semiconductor device of claim 1, wherein the second dielectric constant is greater than each of the first dielectric constant and the third dielectric constant.

5. The semiconductor device of claim 1, wherein the second dielectric spacer is formed of at least one of a porous silicon oxide material, a porous carbon doped silicon nitride material, and an amorphous carbon material.

6. The semiconductor device of claim 1, wherein the second dielectric spacer directly contacts a side of the composite structure, and wherein the third dielectric spacer directly contacts the side of the composite structure.

7. The semiconductor device of claim 1 comprising a dielectric layer, which comprises a first dielectric portion and a second dielectric portion, wherein the second dielectric spacer, the third dielectric spacer, the composite structure, and the first dielectric spacer are positioned between the first dielectric portion and the second dielectric portion, and wherein both the second dielectric spacer and the third dielectric spacer directly contact the first dielectric portion.

8. The semiconductor device of claim 7, wherein a first side of the first dielectric portion directly contacts the fin member, and wherein a second side of the first dielectric portion is not parallel to the first side of the first dielectric portion and directly contacts both the second dielectric spacer and the third dielectric spacer.

9. The semiconductor device of claim 1 comprising a dielectric layer, wherein a first side of the dielectric layer directly contacts a first side of the first doped portion, and wherein a second side of the dielectric layer is not parallel to the first side of the first doped portion and directly contacts both the second dielectric spacer and the third dielectric spacer.

10. The semiconductor device of claim 1, wherein the composite structure comprises a second insulator, which comprises a first insulating portion and a second insulating portion, wherein the conductor is positioned between the first insulating portion and the second insulating portion, and wherein the first insulating portion is positioned between the conductor and each of the second dielectric spacer and the third dielectric spacer.

11. The semiconductor device of claim 10, wherein a side of the first insulating portion directly contacts both the second dielectric spacer and the third dielectric spacer.

12. The semiconductor device of claim 10, wherein the second insulator comprises a third insulating portion, which is positioned between the conductor and the first insulator in the first direction.

13. The semiconductor device of claim 10, wherein a side of the first insulator directly contacts the second insulator, wherein a side of the second dielectric spacer directly contacts the third dielectric spacer, wherein the side of the second dielectric spacer is parallel to the side of the first insulator and is not positioned over the side of the first insulator in the first direction.

14. The semiconductor device of claim 1, wherein a side of the first insulator directly contacts the conductor, wherein a side of the second dielectric spacer directly contacts the third dielectric spacer, and wherein the side of the first insulator is parallel to the side of the second dielectric spacer.

15. A method for manufacturing a semiconductor device, the method comprising:
providing a fin member, which comprises a first doped portion, a second doped portion, and a semiconductor portion positioned between the first doped portion and the second doped portion;
providing a composite structure, which comprises a conductor and a first insulator positioned between the conductor and the semiconductor portion in a first direction;
providing a first dielectric spacer, which has a first dielectric constant and is positioned closer to the second doped portion than to the first doped portion;
providing a second dielectric spacer, which has a second dielectric constant and is positioned closer to the first doped portion than to the second doped portion; and
providing a third dielectric spacer, which has a third dielectric constant, wherein the second dielectric spacer is positioned between the third dielectric spacer and the fin member in the first direction, wherein the composite structure is positioned between the first dielectric spacer and each of the second dielectric spacer and the third dielectric spacer, wherein the composite structure directly contacts each of a face of the first dielectric spacer, a face of the second dielectric spacer, and a face of the third dielectric spacer, wherein all of the face of the first dielectric spacer has the first dielectric constant, wherein a sum of a length of the face of the third dielectric spacer and a length of the face of the second dielectric spacer is equal to a length of the face of the first dielectric spacer, and wherein the first dielectric constant is less than at least one of the second dielectric constant and the third dielectric constant.

16. The method of claim 15 comprising:
providing a dielectric member on the fin member;
at least partially removing the dielectric member to form a cavity; and
providing the third dielectric spacer inside the cavity.

17. The method of claim 16 comprising:
providing a remaining portion of the dielectric member as the second dielectric spacer, wherein the remaining portion of the dielectric member remains after the cavity has been formed, and wherein the third dielectric spacer is provided onto the remaining portion of the dielectric member.

18. The method of claim 16 comprising:
providing the second dielectric spacer into the cavity; and
providing the third dielectric spacer onto the second dielectric spacer.

19. The method of claim 16 comprising:
forming a dummy member on the fin member;
providing the dielectric member on a side of the dummy member;
removing the dummy member to form a hole; and
providing the conductor into the hole for forming the composite structure before forming the cavity, wherein the cavity at least partially exposes a side of the composite structure.

20. The method of claim 19, wherein both the second dielectric spacer and the third dielectric spacer directly contact the side of the composite structure.

* * * * *